(12) United States Patent
Lee

(10) Patent No.: US 7,611,940 B2
(45) Date of Patent: Nov. 3, 2009

(54) CMOS IMAGE SENSOR AND MANUFACTURING METHOD THEREOF

(75) Inventor: Joung Ho Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 308 days.

(21) Appl. No.: 11/503,428

(22) Filed: Aug. 10, 2006

(65) Prior Publication Data

US 2007/0037313 A1    Feb. 15, 2007

(51) Int. Cl.
  *H01L 21/8238* (2006.01)
(52) U.S. Cl. ............... 438/200; 257/E21.352
(58) Field of Classification Search ............ 438/59, 438/200, 237, 407, 528, 545, 923; 257/E21.352
  See application file for complete search history.

(56) References Cited

U.S. PATENT DOCUMENTS

| 5,466,612 | A | 11/1995 | Fuse et al. |
| 6,849,886 | B1* | 2/2005 | Han ........................ 438/73 |
| 2005/0062084 | A1 | 3/2005 | Han |

OTHER PUBLICATIONS

Chinese Office Action for Application No. 2006101093278; State Intellectual Property Office of People's Republic of China: Dated Oct. 12, 2007.

US Translation of Chinese Office Action titled: CMOS Image Sensor and Manufacturing Method Thereof: Application No. 200610109327.8: State Intellectual Property Office of People's Republic of China: Dated Oct. 12, 2007.

\* cited by examiner

*Primary Examiner*—Chandra Chaudhari
(74) *Attorney, Agent, or Firm*—The Law Offices of Andrew D. Fortney; Andrew D. Fortney

(57) ABSTRACT

Disclosed are a CMOS image sensor and a manufacturing method thereof. The method includes forming an isolation layer in a semiconductor substrate, defining an active region including a photo diode region and a transistor region; forming a gate insulating layer and a gate electrode on the transistor region; forming a first low-concentration diffusion region in the photo diode region; forming a second low-concentration diffusion region in the transistor region; forming an insulating layer over an entire surface of the substrate; implanting fluorine ions in an upper surface of the photo diode region; etching the insulating layer to form insulating sidewalls on sides of the gate electrode; forming a high-concentration diffusion region in the transistor region partially overlapping with the second low-concentration diffusion region; and forming a third low-concentration diffusion region on the upper surface of the photo diode region, the third low-concentration diffusion region having a conductivity type opposite to the first low-concentration diffusion region.

16 Claims, 9 Drawing Sheets

US 7,611,940 B2

CMOS IMAGE SENSOR AND MANUFACTURING METHOD THEREOF

This application claims the benefit of Korean Application No. 10-2005-0073264, filed on Aug. 10, 2005, which is incorporated by reference herein in its entirety.

BACKGROUND OF THE INVENTION

1. Field of the Invention

The present invention relates to an image sensor, more specifically, to a complementary metal oxide semiconductor (CMOS) image sensor and manufacturing method thereof.

2. Description of the Related Art

An image sensor, as a kind of semiconductor device, transforms optical images into electrical signals. Image sensors can be generally classified into a charge coupled device (CCD) and a CMOS image sensor.

Conventionally, a CCD comprises a plurality of photo diodes arranged in the form of matrix to transform optical signal into electrical signal, a plurality of vertical charge coupled devices (VCCDs) formed between the photo diodes to transmit charges generating in each photo diode in a vertical direction, a plurality of horizontal charge coupled devices (HCCDs) for transmitting charges transmitted from each VCCDs in a horizontal direction, and a sense amplifier for sensing charges transmitted in the horizontal direction to output electrical signals.

It has been generally known that CCDs have complicated operational mechanisms and high power consumption. In addition, its manufacturing method is relatively complicated, because multiple steps of photolithography processes are required. Especially, it is difficult to integrate a CCD with other devices such as control circuits, signal processing circuits, analog/digital converter, etc., on a single chip. Such disadvantages of CCDs may hinder miniaturization of products containing a CCD.

In order to overcome above described disadvantages of CCDs, CMOS image sensors have been recently developed in the oncoming generation(s) of image sensors. A CMOS image sensor comprises MOS transistors formed in a semiconductor substrate by CMOS fabrication technologies. In CMOS image sensor, the MOS transistors are formed relative to the number of unit pixels, along with peripheral circuits such as control circuits, signal processing circuits, and the like. CMOS image sensor employs a switching mode that MOS transistors successively detect the output of each pixel.

More specifically, a conventional CMOS image sensor may comprise a photo diode and a certain number of MOS transistors in each pixel, thereby successively detecting electrical signals of each pixel in a switching mode to express a given image.

The CMOS image sensor has advantages such as low power consumption and relatively simple fabrication process. In addition, the CMOS image sensor can be integrated with control circuits, signal processing circuits, analog/digital converter(s), etc., because such circuits can be manufacturing using CMOS manufacturing technologies, which enables miniaturization of products. CMOS image sensors have been widely used in a variety of applications such as digital still cameras, digital video cameras, and the like.

Meanwhile, CMOS image sensors can be classified into 3T, 4T, 5T types, etc., according to the number of transistors in a unit pixel. The 3T type CMOS image sensor comprises one photo diode and three transistors, and the 4T type comprises one photo diode and four transistors. Here, a unit pixel layout of the 3T type CMOS image sensor is configured as follows.

FIG. 1 is a circuit diagram of a conventional CMOS image sensor, and FIG. 2 is a layout illustrating a unit pixel in the conventional 3T type CMOS image sensor.

As shown in FIG. 1, a unit pixel of the conventional 3T type CMOS image sensor comprises one photo diode PD and three NMOS transistors T1, T2, and T3. A cathode of the photo diode PD is connected to a drain of the first NMOS transistor T1 and a gate of the second NMOS transistor T2.

Especially, sources of the first and second NMOS transistors T1 and T2 are connected to a supply terminal (VR) for supplying a standard voltage, and a gate of the first NMOS transistor T1 is connected to a reset terminal for supplying a reset signal (RST).

In addition, a source of the third NMOS transistor T3 is connected to a drain of the second NMOS transistor T2, and a drain of the third NMOS transistor T3 is connected to a detecting circuit (not shown) via a signal line. Furthermore, a gate of the third NMOS transistor T3 is connected to a select signal line SLCT.

Here, the first NMOS transistor T1 is a reset transistor Rx for resetting photoelectrons collected in the photo diode PD. The second NMOS transistor T2 is a drive transistor Dx functioning as a source follower buffer amplifier. In addition, the third NMOS transistor T3 is a select transistor Sx functioning as a switch and addresser.

In the conventional 3T type CMOS image sensor, as shown in FIG. 2, one photo diode 20 is formed in a large portion of a defined active region 10, and three gate electrodes 120, 130, and 140 of the first to third transistors are respectively formed to be overlapped in other portion of the active region 10.

The first gate electrode 120 constitutes the reset transistor Rx. The second gate electrode 130 constitutes the drive transistor Dx. The third gate electrode 140 constitutes the select transistor Sx.

Here, dopant ions are implanted in the active region 10 where each transistor is formed, except for the portion of active region below each gate electrodes 120, 130, and 140, to form source and drain regions of each transistor.

Here, a supply voltage Vdd is applied to source/drain regions between the reset transistor Rx and the drive transistor Dx, and the source/drain regions formed at one side of the select transistor Sx is connected to detecting circuits (not shown).

The above-described gate electrodes 120, 130, and 140 are respectively connected to signal lines, and each signal line is connected to external driving circuits via predetermined pads, even which are not shown.

FIGS. 3a to 3e are cross-sectional views successively illustrating a conventional method for manufacturing a CMOS image sensor, in view of III-III' line in FIG. 2.

As shown in FIG. 3a, a low concentration of P− type epitaxial layer 62 is formed on a heavy concentration of a P++ type semiconductor substrate 61, using an epitaxial process. Here, the low concentration of P− type epitaxial layer 62 is formed in a thickness of 4~7 μm.

Subsequently, after photolithographically masking an active region and exposing an isolation region on the semiconductor substrate 61, an isolation layer 63 is formed in the isolation region using a shallow trench isolation (STI) process or a local oxidation of silicon (LOCOS) process.

Next, a gate insulating layer 64 and a conductive layer (e.g., a heavy doped polysilicon layer) are deposited on the entire surface of the epitaxial layer 62, in successive order. The conductive layer and the gate insulating layer 64 are selectively patterned using photolithography and etching processes, thus forming the gate electrode 65.

Referring to FIG. 3b, a first photoresist layer 66 is applied over the entire surface of the semiconductor substrate 61 including the gate electrode 65, and then it is patterned using exposure and development processes, thus covering the photo diode region and exposing the transistor region where source/drain regions will be formed.

Using the first photoresist pattern 66 as a mask, a low concentration of N-type dopant ions are implanted in the exposed transistor region to form a low concentration of N-type diffusion region 67.

As shown in FIG. 3c, after removal of the first photoresist pattern 66, a second photoresist layer 68 is applied over the semiconductor substrate 61, and then it is patterned using exposure and development processes, thus exposing the photo diode region.

Then, using the second photoresist pattern 68 as a mask, a low concentration of N-type dopant ions are implanted in the exposed photo diode region of the epitaxial layer 62, thus forming a low concentration of N-type diffusion region 69.

Here, the low concentration of N-type diffusion region 69 is preferably formed at a depth greater than that of the low concentration of N-type diffusion region 67, using a higher implantation energy than that used to form N-type diffusion region 67.

Preferably, the N-type diffusion region 69 is formed deeper to improve the sensitivity of the image sensor.

Here, the N-type diffusion region 69 functions as a source of the reset transistor, referred to as Rx in FIGS. 1 and 2.

In the above-described structure of CMOS image sensor, a reverse bias is applied between the N-type diffusion region 69 of the photo diode and the low concentration of P-type epitaxial layer 62, thus resulting in a depletion layer where electrons are generated by a light. When the reset transistor Rx turns off, the generated electrons lower the potential of the drive transistor Dx. Lowering of potential of the driver transistor proceeds continuously from turn-off of the reset transistor Rx, thus resulting in potential difference. The image sensor can be operated by detecting the potential difference as a signal.

As shown in FIG. 3d, after removing the second photoresist pattern 68, an insulating layer is formed over the entire surface of the substrate 61. Then, an etch-back process is preformed on the insulating layer to form insulating sidewalls 70 on both sides of the gate electrode 65.

A third photoresist layer 71 is then formed over the entire surface of the substrate 61, and then it is patterned by exposure and development processes to cover the photo diode region and expose the transistor source/drain regions.

Using the third photoresist pattern 71 as a mask, a high concentration of N-type dopant ions are implanted in source/drain regions to form a high concentration of N-type diffusion region 72, i.e., a N+ type diffusion region.

As shown in FIG. 3e, after removing the third photoresist pattern 71, a fourth photoresist layer 73 is applied over the entire surface of the substrate 61, and then it is patterned by exposure and development processes to expose the photo diode region.

Subsequently, using the photoresist pattern 73 as an etching mask, P-type dopant ions are implanted in the photo diode region where the N-type diffusion region 69 is formed, thus forming a P0 type diffusion region 74 in the vicinity of the surface of the epitaxial layer 62.

The above-described conventional CMOS image sensor has disadvantages due to increase of dark currents, such as deterioration of device performances (e.g., charge storage capability).

Here, dark currents, as a kind of noise appearing in a displayed image, are induced by current leakage that can be mainly generated in the photo diode region.

In general, the current leakage may appear in interface trap defects in the vicinity of the sidewall of the isolation layer, and in surface defects of the photo diode.

Conventionally, in order to remove the interface trap defects arousing the dark current, the device is annealed in a furnace to join dangling bonds of silicon with hydrogen. However, Si—H bonds are weak to be easily broken during operation of the device.

SUMMARY OF THE INVENTION

It is, therefore, an object of the present invention to provide a CMOS image sensor and a manufacturing method thereof, wherein fluorine ions are implanted in an upper surface of a photo diode, thus reducing surface defects resulting in dark currents.

To achieve the above object, an embodiment of a method for manufacturing a CMOS image sensor, according to the present invention, comprises the steps of: forming an isolation layer in a semiconductor substrate, defining an active region including a photo diode region and a transistor region; forming a gate insulating layer and a gate electrode on the transistor region; forming a first low-concentration diffusion region in the photo diode region; forming a second low-concentration diffusion region in the transistor region; forming an insulating layer over an entire surface of the substrate; implanting fluorine ions in an upper surface of the photo diode region; etching the insulating layer to form insulating sidewalls on sides of the gate electrode; forming a high-concentration diffusion region in the transistor region partially overlapping with the second low-concentration diffusion region; and forming a third low-concentration diffusion region on the upper surface of the photo diode region, the third low-concentration diffusion region having a conductivity type opposite to the first low-concentration diffusion region.

In a CMOS image sensor including a photo diode and a MOS transistor according to the present invention, the photo diode comprises: a first low-concentration diffusion region in a semiconductor substrate, having a conductivity type opposite to the substrate; and a fluorine implant layer in an upper surface of the substrate, at least partially overlapping with the first low-concentration diffusion region.

These and other aspects of the invention will become evident by reference to the following description of the invention, often referring to the accompanying drawings.

DETAILED DESCRIPTION OF THE INVENTION

Figure 1:
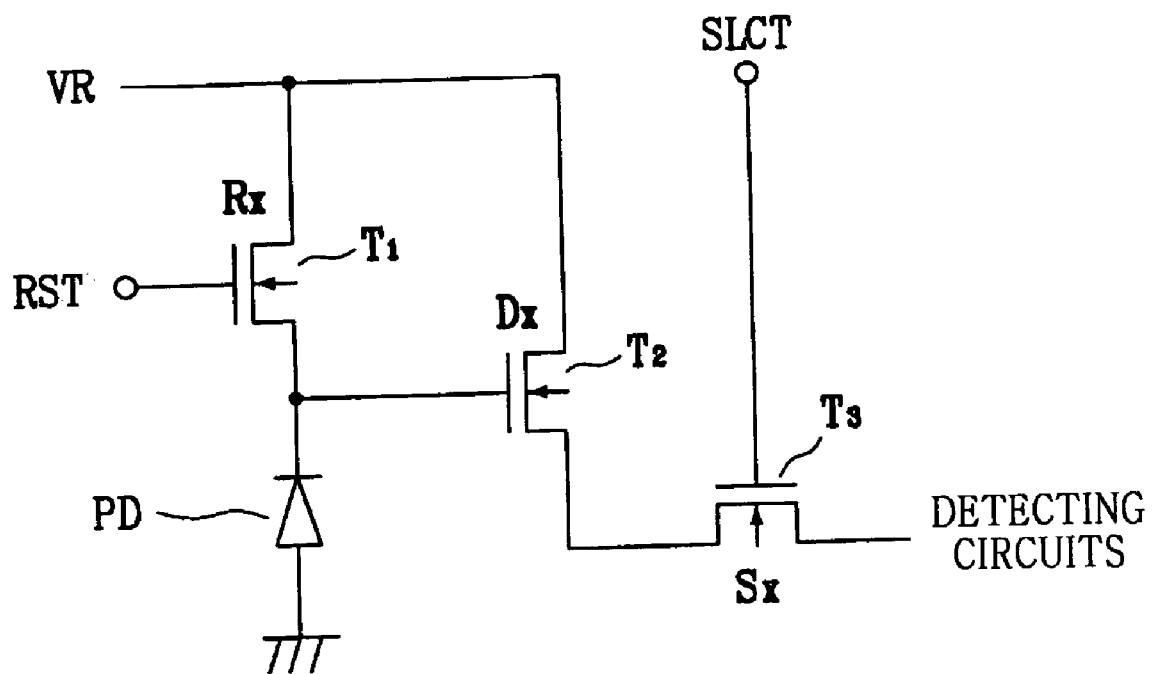
FIG. 1 is a circuit diagram of a conventional CMOS image sensor.
Figure 2:
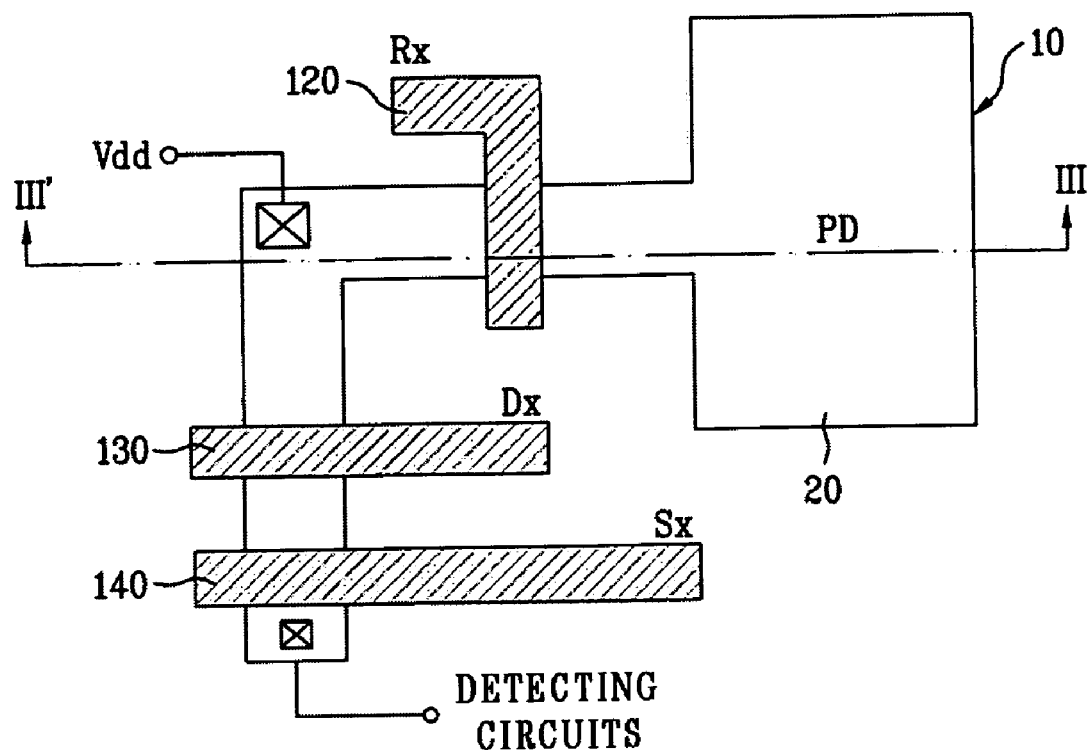
FIG. 2 is a layout illustrating a unit pixel in the conventional 3T type CMOS image sensor.
Figure 3A:
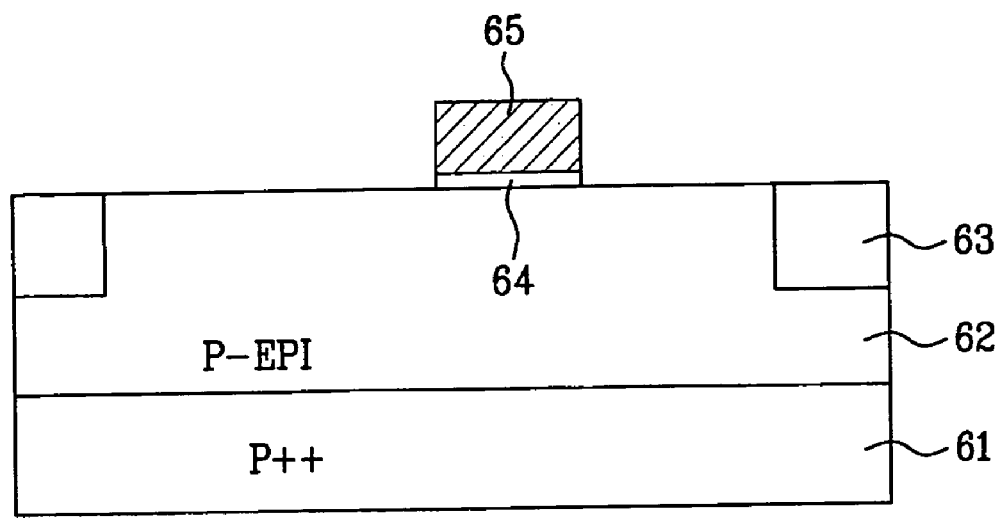
FIGS. 3a to 3e are cross-sectional views illustrating a conventional method for manufacturing a CMOS image sensor, in view of III-III' line in FIG. 2.
Figure 3B:
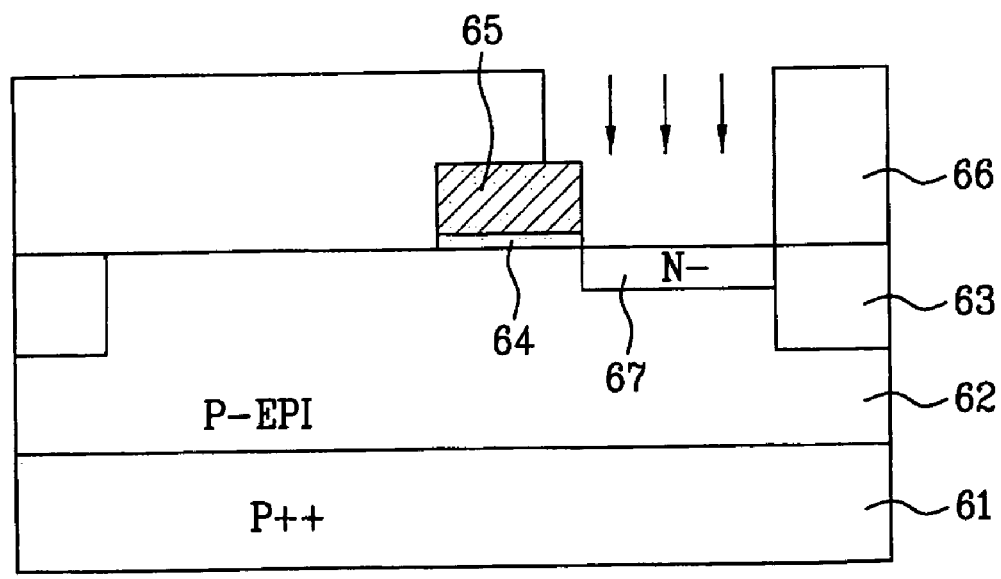
Figure 3C:
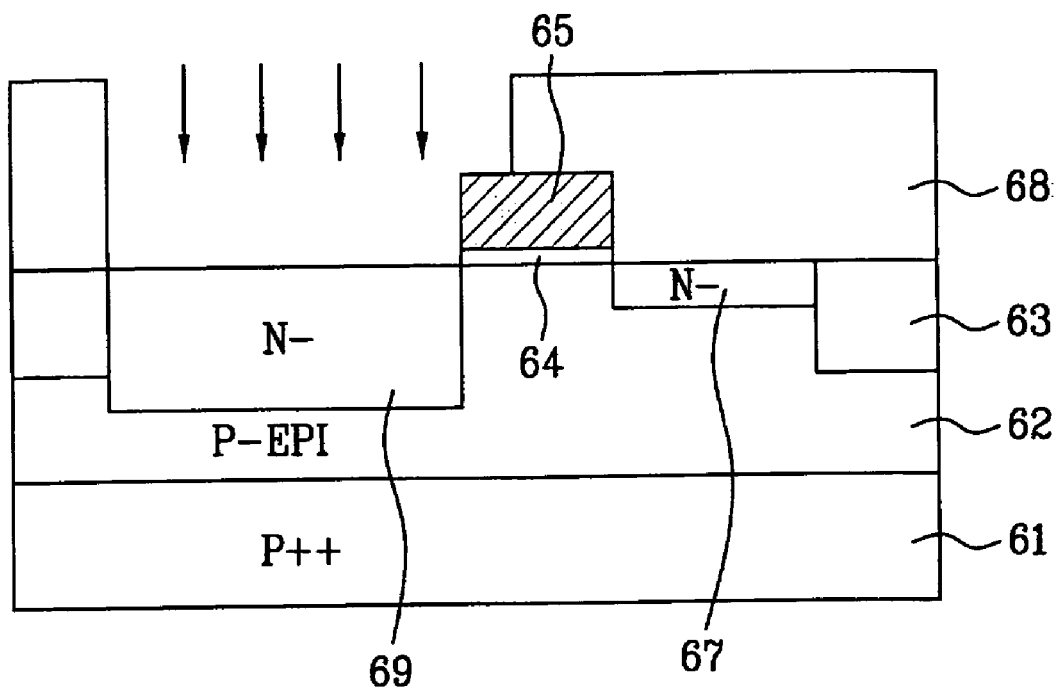
Figure 3D:
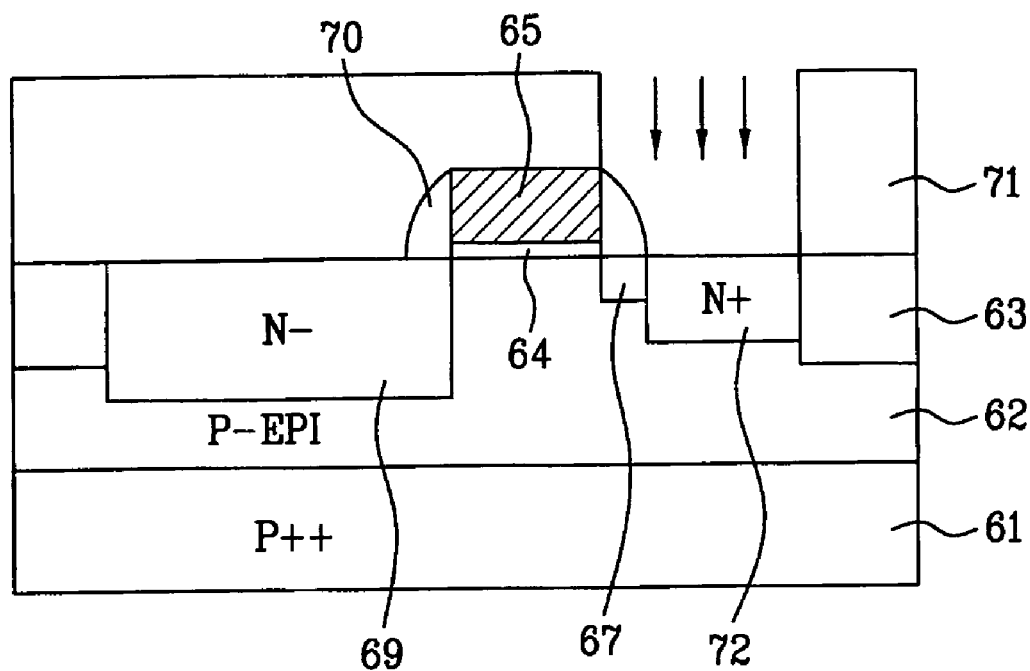
Figure 3E:
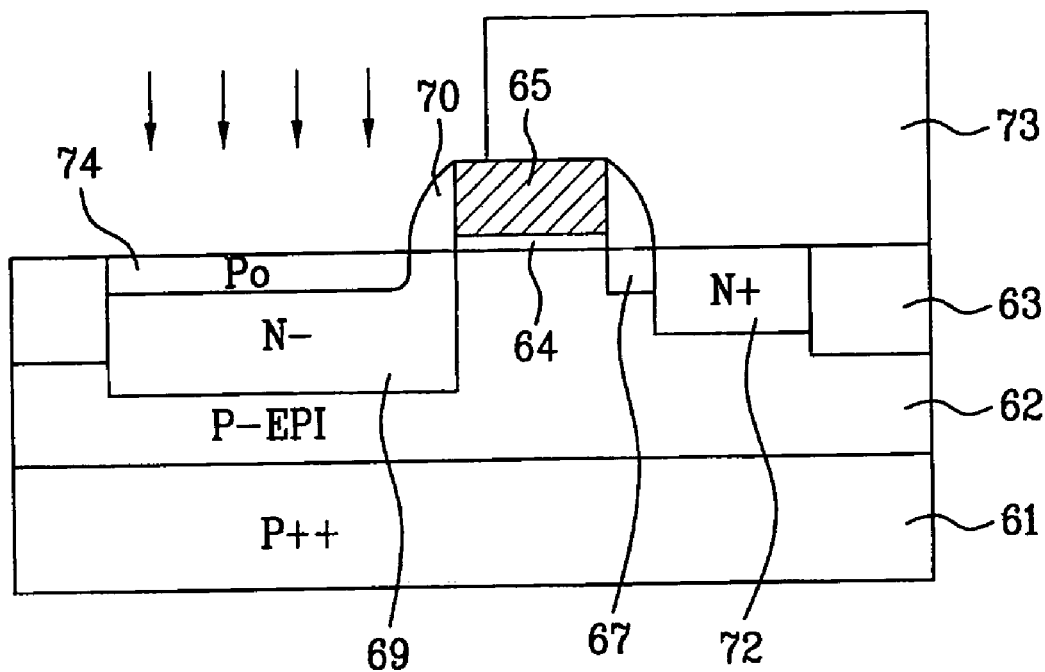

FIGS. 4a to 4f are cross-sectional views illustrating a method for manufacturing a CMOS image sensor, in view of III-III' line in FIG. 2.

Figure 4A:
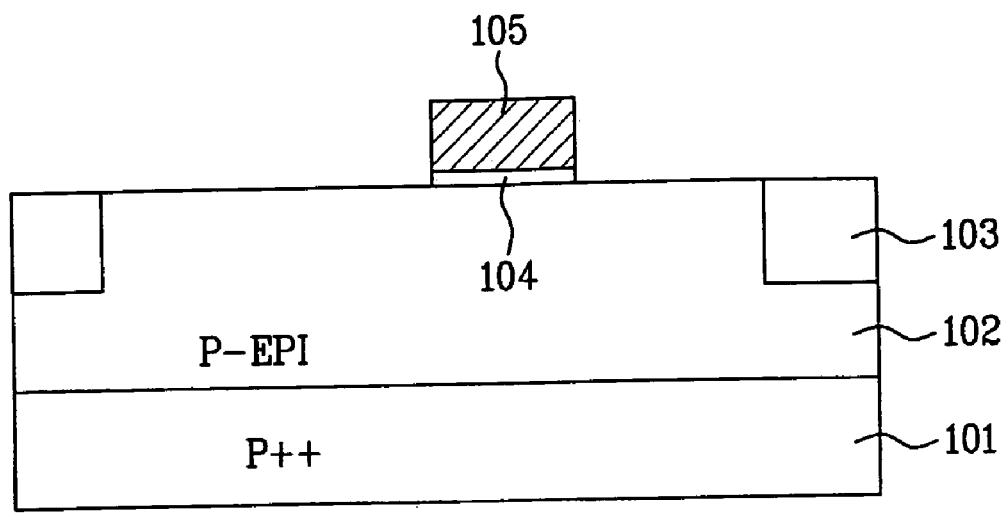
FIGS. 4a to 4f are cross-sectional views illustrating a method for manufacturing a CMOS image sensor, in view of III-III' line in FIG. 2.

As shown in FIG. 4a, an epitaxial layer 102 (e.g., having a relatively low concentration of a P-type dopant) is formed on a semiconductor substrate 101 (e.g., a single crystalline silicon substrate, which may have a relatively heavy concentration of a P-type dopant; e.g., a P++ substrate), using an epitaxial process.

Here, the epitaxial layer 102 functions to form a deep and wide depletion region in the photo diode region. Thereby, the ability of a low-voltage photo diode for gathering photoelectrons can be improved, and also the light sensitivity can be improved.

Alternatively, the semiconductor substrate 101 can be an N-type semiconductor substrate, and the epitaxial layer can be a P-type epitaxial layer.

Here, the epitaxial layer 102 has a thickness of 4~7 μm.

Subsequently, an isolation layer 103 is formed on the substrate 101 to isolate circuit elements that will be formed in the subsequent process.

Here, formation of the isolation layer 103 is performed as follows, even though it is not shown in the drawing.

Firstly, a pad oxide layer, a pad nitride layer, and a TEOS (Tetra Ethyl Ortho Silicate) oxide layer are formed in successive order, and a photoresist layer is applied on the TEOS oxide layer.

Next, using a mask defining an active region and an isolation region, the photoresist layer is exposed and developed to form a photoresist pattern. Especially, the portion of the photoresist layer on the isolation region is removed.

After that, the portions of the TEOS oxide layer, the pad nitride layer, and the pad oxide layer over the isolation region are selectively removed using the photoresist pattern as an etching mask.

In addition, using the patterned TEOS oxide layer, pad nitride layer, and pad oxide layer as an etching mask, a portion of the substrate is etched in a predetermined depth to form a trench.

Afterward, a sacrificial oxide layer may be formed on the exposed surface of the substrate through the trench, and the trench is filled with an insulator, such as a silicon dioxide (e.g., an $O_3$ TEOS oxide) layer. The sacrificial oxide layer is preferably formed in or on the inner wall of the trench, and the $O_3$ TEOS oxide layer is formed at a temperature of about 1,000° C. or more.

After filling the trench, the portion of the $O_3$ TEOS oxide layer outside the trench and pad layers is removed by a chemical mechanical polishing, thus forming the isolation layer 103 in the trench. Then, the pad oxide layer, the pad nitride layer, and the TEOS oxide layer are removed.

Next, a gate insulating layer 104 and a conductive layer (e.g., a heavy doped polysilicon layer) are deposited on the entire surface of the epitaxial layer 102, in successive order. The conductive layer and the gate insulating layer 104 are selectively patterned using photolithography and etching process, thus forming the gate electrode 105. The gate insulating layer 104 can be formed using thermal oxidation process or chemical vapor deposition (CVD) process.

Figure 4B:
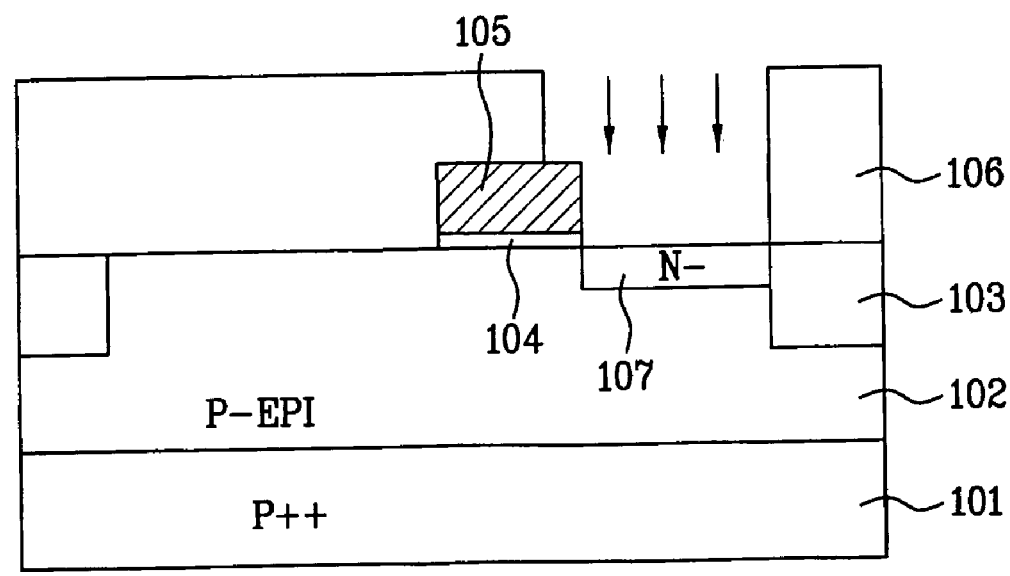

Referring to FIG. 4b, a first photoresist layer 106 is applied over the entire surface of the semiconductor substrate 101 including the gate electrode 105, and then it is patterned using exposure and development processes, thus covering the photo diode region and exposing the transistor region where source/drain regions will be formed.

Using the first photoresist pattern 106 as a mask, a low concentration of N-type dopant ions are implanted in the exposed transistor region to form a low concentration N-type diffusion region 107.

Figure 4C:
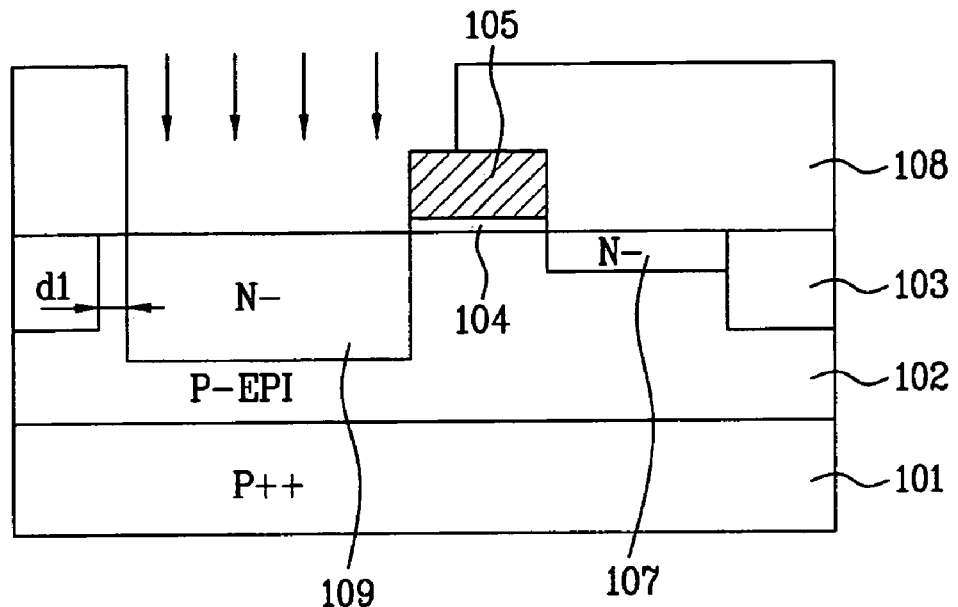

As shown in FIG. 4c, after removal of the first photoresist pattern 106, a second photoresist layer 108 is applied over the semiconductor substrate 101, and then it is patterned using exposure and development processes, thus exposing the photo diode region.

Then, using the second photoresist pattern 108 as a mask, a low concentration of N-type dopant ions are implanted in the exposed photo diode region of the epitaxial layer 102, thus forming a low concentration N-type diffusion region 109.

Here, the low concentration N-type diffusion region 109 is preferably formed at a depth greater than that of the low concentration N-type diffusion region 107, using a higher implantation energy than that used to form N-type diffusion region 107.

In addition, the N-type diffusion region 109 is preferably formed a predetermined distance d from the isolation layer 103. In other words, the second photoresist pattern 108 preferably covers a portion of the active region beyond the isolation layer 103.

Figure 4D:
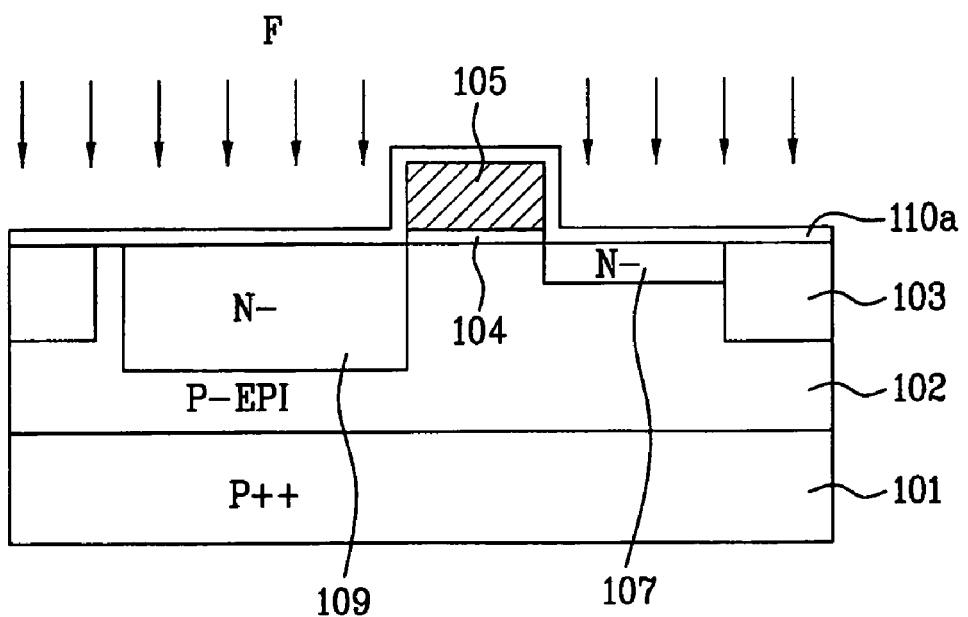

As shown in FIG. 4d, the second photoresist pattern 108 is completely removed, and then an insulating layer 110a is formed over the entire surface of the substrate 101.

Here, the insulating layer 110a may comprise a nitride layer, a TEOS oxide layer, or a bilayer thereof. Next, fluorine (F) ions are implanted in the entire surface of the epitaxial layer 102 through the insulating layer 110a.

Here, the implantation of fluorine ions is performed on an upper portion of the N-type diffusion region 109 in the photo diode region, with an implantation energy that is determined according to the thickness of the insulating layer 110a. In other words, the fluorine ion implantation energy corresponds to the thickness of the insulating layer 110a according to a known and/or predetermined relationship (e.g., the greater the thickness of the insulating layer 110a, the higher the fluorine ion implantation energy).

When fluorine ions are implanted in the upper portion of the N-type diffusion region 109, fluorine-silicon bonds are generated to reduce surface trap sites (or leakages) that may cause dark currents. The fluorine-silicon bond is stronger than the silicon-hydrogen bond, so that it rarely breaks (e.g., under conditions typically encountered in operation of a CMOS image sensor).

Figure 4E:
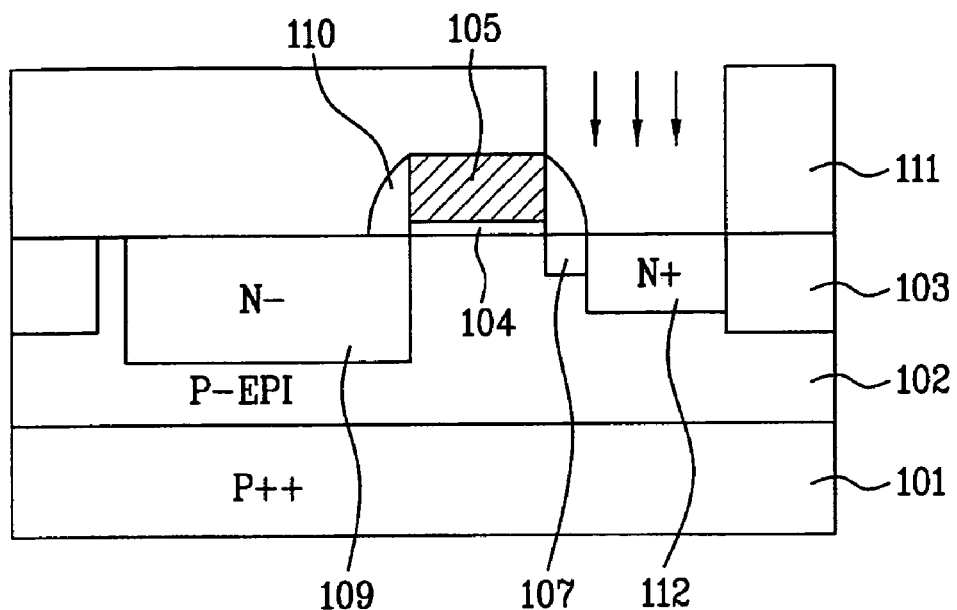

As shown in FIG. 4e, an etch-back process (e.g., an anisotropic reactive ion etching process) is performed on the insulating layer 110a to form insulating sidewalls 110 on sides of the gate electrode 105.

A third photoresist layer 111 is then formed over the entire surface of the substrate 101, and then it is patterned by exposure and development processes to cover the photo diode region and expose the transistor source/drain regions.

Using the third photoresist pattern 111 as a mask, a high concentration of N-type dopant ions are implanted in source/drain regions to form a high concentration N-type diffusion region 112, i.e., a N+ type diffusion region.

Figure 4F:
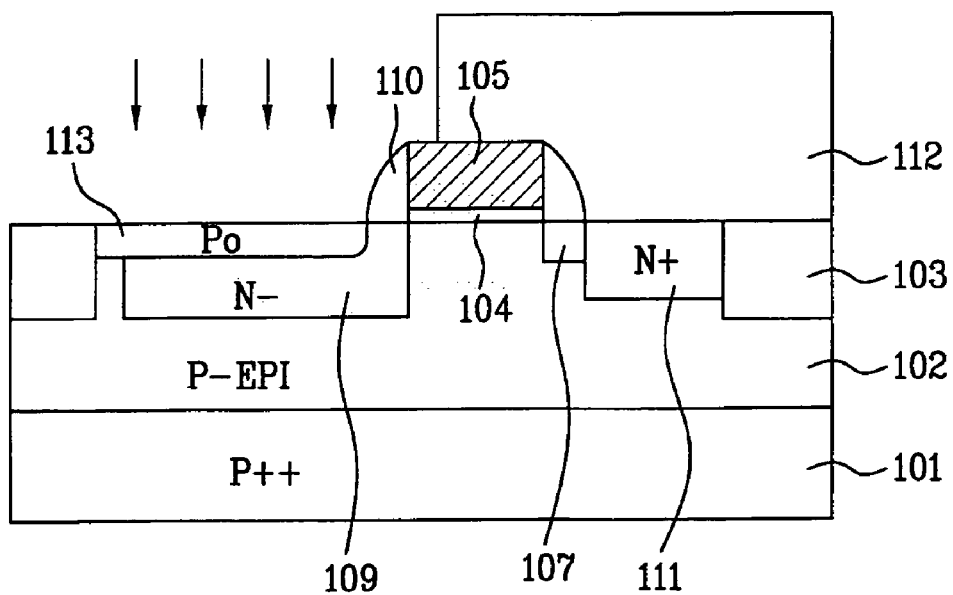

As shown in FIG. 4f, after removing the third photoresist pattern 111, a fourth photoresist layer 112 is applied over the entire surface of the substrate 101, and then it is patterned by exposure and development processes to expose the photo diode region.

Subsequently, using the photoresist pattern 112 as an etching mask, P-type dopant ions are implanted in the photo diode region where the N-type diffusion region 109 is formed, thus forming a P0 type diffusion region 113 in the vicinity of the surface of the epitaxial layer 102.

Here, the P0 type diffusion region 113 is formed to a depth of 0.1~1.0 μm.

Afterward, the subsequent processes, which are not shown, are performed to manufacture a CMOS image sensor, after removing the fourth photoresist pattern 112.

In the above-described method for manufacturing a CMOS image sensor according to the present invention, fluorine ions are implanted in the upper portion of the photo diode region so that fluorine-silicon bonds stronger than silicon-hydrogen bonds can be generated to reduce surface leakage causing dark currents. The fluorine-silicon bonds rarely tend to break during heat-treating or operating the device.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a CMOS image sensor, comprising the steps of:
    forming an isolation layer in a semiconductor substrate, defining an active region including a photo diode region and a transistor region;
    forming a gate insulating layer and a gate electrode on the transistor region;
    forming a first low-concentration diffusion region in the photo diode region;
    forming a second low-concentration diffusion region in the transistor region;
    forming an insulating layer over an entire surface of the substrate;
    implanting fluorine ions through the insulating layer into an upper surface of the photo diode region and the second low-concentration diffusion region;
    etching the insulating layer through which fluorine was implanted to form insulating sidewalls on sides of the gate electrode in the transistor region and the photo diode region;
    forming and patterning a first photoresist layer to expose the transistor region and the insulating sidewall in the transistor region;
    forming a high-concentration diffusion region in the transistor region partially overlapping with the second low-concentration region using the first photoresist layer and the insulating sidewall in the transistor region as a mask;
    forming and patterning a second photoresist layer to expose the photo diode region and the insulating sidewall in the photo diode region; and
    forming a third low-concentration diffusion region on the upper surface of the photo diode region using the second photoresist layer, gate electrode and the insulating sidewall in the photo diode region as a mask, the third low-concentration diffusion region having a conductivity type opposite to the first low-concentration diffusion region.

2. The method of claim 1, wherein the first low-concentration diffusion region is formed a predetermined distance from the isolation layer.

3. The method of claim 1, wherein the insulating layer comprises at least one of a nitride layer and a TEOS oxide layer.

4. The method of claim 1, wherein the fluorine ions are implanted at an implantation energy that corresponds to a thickness of the insulating layer.

5. A method for manufacturing a CMOS image sensor, comprising the steps of:
    forming an insulating layer over an active region of a semiconductor substrate, the active region including a photo diode region and a transistor region, the photo diode region including a first low-concentration diffusion region therein, and the transistor region including a gate insulating layer and a gate electrode thereon;
    implanting fluorine ions through the insulating layer into an upper surface of the photo diode region and the transistor region;
    etching the insulating layer through which fluorine was implanted to form insulating sidewalls on sides of the gate electrode in the photo diode region and the transistor region;
    forming and patterning a first photoresist layer to expose the transistor region and the insulating sidewall in the transistor region;
    forming a high-concentration diffusion region in the transistor region using the first photoresist layer and the insulating sidewall in the transistor region as a mask;
    forming and patterning a second photoresist layer to expose the photo diode region and the insulating sidewall in the photo diode region; and
    forming a complementary low-concentration diffusion region on the upper surface of the photo diode region, partially overlapping with the first low-concentration diffusion region, using the second photoresist layer, gate electrode and the insulating sidewall in the photo diode region as a mask.

6. The method of claim 5, further comprising forming an isolation layer in a field region of the substrate.

7. The method of claim 6, comprising forming the first low-concentration diffusion region a predetermined distance from the isolation layer.

8. The method of claim 5, wherein the insulating layer comprises at least one of a nitride layer and a TEOS oxide layer.

9. The method of claim 5, wherein forming the insulating sidewalls comprises anisotropically etching the insulating layer.

10. The method of claim 5, wherein the fluorine ions are implanted at an implantation energy that corresponds to a thickness of the insulating layer.

11. The method of claim 5, further comprising forming the gate insulating layer and the gate electrode.

12. The method of claim 11, further comprising forming the first low-concentration diffusion region in the photo diode region, using the gate electrode as a mask.

13. The method of claim 11, further comprising forming a second low-concentration diffusion region in the transistor region, using the gate electrode as a mask.

14. The method of claim 5, wherein forming the complementary low-concentration diffusion region comprises implanting ions having a conductivity type opposite to a dopant in the first low-concentration diffusion region into the photodiode region, using the insulating sidewalls as a mask.

15. The method of claim 1, wherein implanting fluorine ions through the insulating layer further comprises implanting fluorine ions in the gate electrode.

16. The method of claim 5, wherein implanting fluorine ions through the insulating layer further comprises implanting fluorine ions in the gate electrode.

* * * * *